United States Patent [19]

Longini

[11] Patent Number: 5,325,048
[45] Date of Patent: Jun. 28, 1994

[54] METHOD AND APPARATUS FOR CALIBRATING A DIGITAL ELECTRIC ENGERGY CONSUMPTION METER

[75] Inventor: Richard L. Longini, Mars, Pa.

[73] Assignee: Digital KWH Inc., Pittsburgh, Pa.

[21] Appl. No.: 868,133

[22] Filed: Apr. 14, 1992

[51] Int. Cl.⁵ ............................................. G01R 35/04
[52] U.S. Cl. ...................................... 324/74; 324/130; 364/571.01
[58] Field of Search ................. 324/74, 130, 142, 166, 324/158 R; 364/571.02, 571.04, 571.07, 571.01

[56] References Cited

U.S. PATENT DOCUMENTS

| | | | |
|---|---|---|---|
| 4,197,585 | 4/1980 | Moorey et al. | 324/166 |
| 4,528,503 | 7/1985 | Cole | 324/158 R |
| 4,799,005 | 1/1989 | Fernandes | 324/142 |
| 4,949,029 | 8/1990 | Cooper et al. | 324/74 |
| 5,018,087 | 5/1991 | Dannenberg | 324/166 |

Primary Examiner—Ernest F. Karlsen
Attorney, Agent, or Firm—Carothers and Carothers

[57] ABSTRACT

A method and apparatus for calibrating a digital electric energy consumption meter of the type which performs voltage and current sampling in timed cycle clusters and then performs algorithmic or Fourier analysis on the sampling to determine the electrical energy being sampled. The meter includes a computer for performing this analysis and this meter computer further includes a microprocessor, appropriate memory for the microprocessor, a clock for timing and initiation of the sampling, a calibration synchronizing signal output for generating a calibration start output signal when the meter begins the sampling, and an input for entering calibration factors into meter memory. The calibration stand electronically calibrates the meter by generating and sending standardized current and voltage, which need not be the same wave forms, to the meter for sampling when the calibration stand receives the calibration start signal from the meter thereby synchronizing the voltage and current source of the calibration stand with the meter sampling. Thereupon the meter calculates and sends back to the calibration stand either computed uncalibrated power or computed algorithmic or Fourier component magnitudes and the calibration stand then computes the relevant calibration factors for the meter being calibrated and sends the calibration factors to the meter for storage in memory to thereby calibrate the meter.

11 Claims, 1 Drawing Sheet

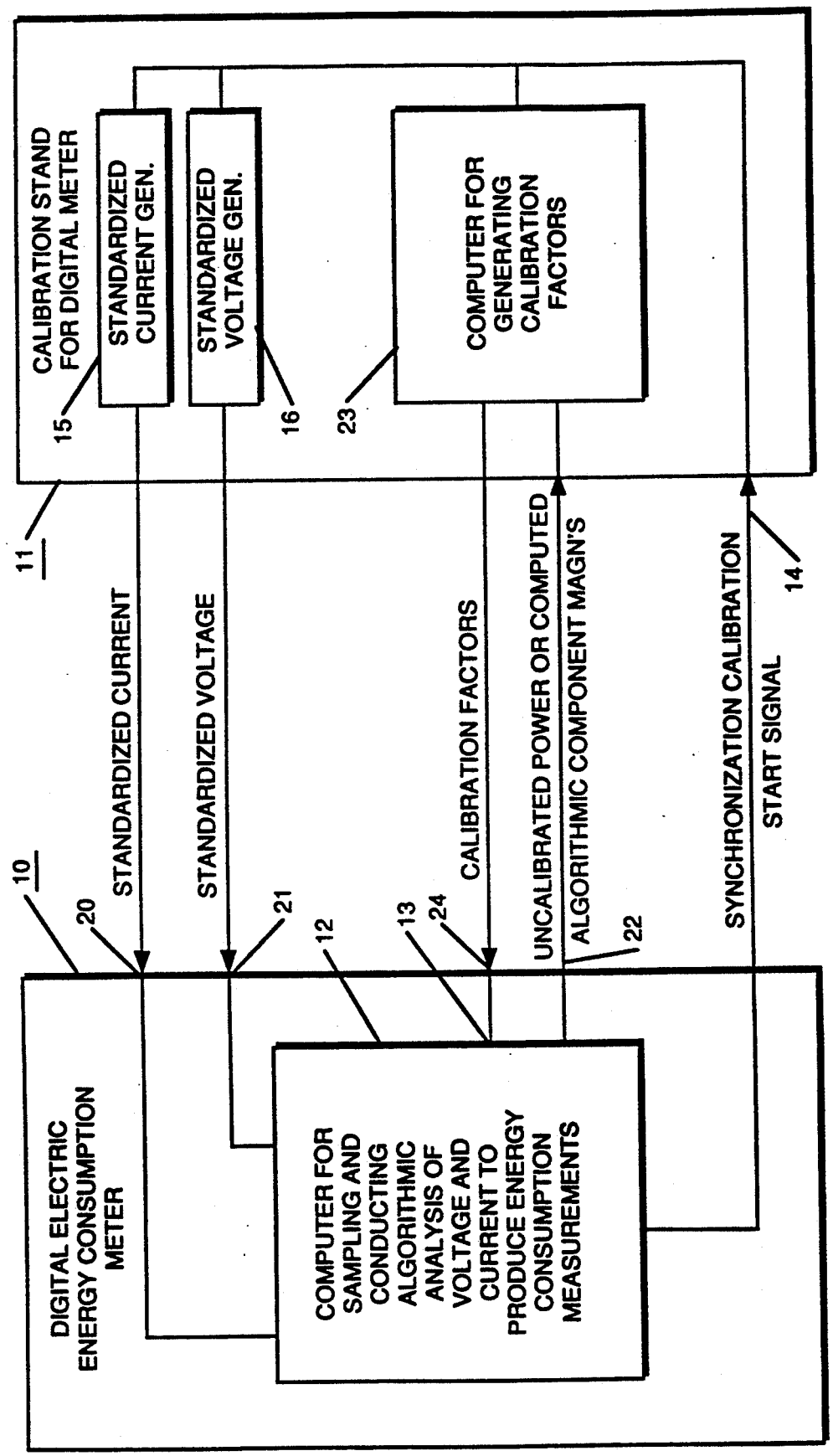

METHOD AND APPARATUS FOR CALIBRATING A DIGITAL ELECTRIC ENGERGY CONSUMPTION METER

BACKGROUND OF THE INVENTION

This invention relates generally to a method and apparatus for calibrating digital electric energy consumption meters after manufacture but before installation in order to insure that the meters are operating accurately. More particularly, this invention is an improved method and apparatus for calibrating digital electric energy consumption meters of the type described in my U.S. Pat. No. 5,061,890 which issued on Oct. 29, 1991 and as further described in my copending patent application Ser. No. 07/766,136 which was filed on Sep. 27, 1991. The patent specification is incorporated herein by reference.

All electric energy consumption meters, be they digital or analog, must be calibrated prior to installation to be certain that they are operating accurately. The conventional analog meters which are presently in use generally require several minutes to calibrate prior to packing and shipping. I have discovered a unique method and apparatus for calibrating the digital electric energy consumption meters described in my aforementioned patent disclosures which may be accomplished in a matter of a few seconds or less as opposed to a few minutes.

My aforementioned patent disclosures disclose a digital electric energy consumption meter which performs voltage and current sampling in timed cycle clusters. Readings of voltage and current need not be simultaneous and also if desired the actual measurement of current need not be taken directly from the power source at prevalent voltage potentials and therefore less expensive hardware is required and also very low computing power is required since relatively few readings are necessary for acceptable accuracy. All of this is described in greater detail in both of the above-identified patent disclosures.

My above-described digital electric energy consumption or watt hour meter performs algorithmic analysis on these voltage and current samplings to determine the electrical energy being sampled through the use of a computer which includes a microprocessor, appropriate memory, and a clock for timing and initiation of sampling. The algorithmic analysis performed on the current and voltage samplings is preferably Fourier Series based. I have discovered a very unique method and apparatus for calibrating this meter which varies significantly from the calibration techniques for the old revolving disk analog meters and other digital meters.

SUMMARY OF THE INVENTION

For the unique method and apparatus for calibrating the aforedescribed digital meter, the meter itself is further provided with a calibration synchronizing signal output for generating a calibration start output signal when sampling by the meter of the current and voltage begins. The digital meter is also further provided with an input for entering calibration factors into the meter memory to thereby calibrate the meter.

The calibration stand which is utilized in the method and apparatus of the present invention for calibrating my digital meter generally comprises a current and a voltage generator for generating standardized current and voltage signals for sampling by the meter when the calibration stand receives the calibration start output signal from the meter. These standardized current and voltage signals may be generated by separate circuits. In that situation, the standardized current and voltage may have a frequency that is not the "line" frequency for which the meter is designed.

The meter then computes uncalibrated power or computes at least algorithmic or Fourier component magnitudes and a computer is provided in the calibration stand for receiving either the computed uncalibrated power or the computed algorithmic component magnitudes from the meter. The calibration stand computer then evaluates this power reading or these component magnitudes and computes relevent calibration factors for the meter with respect to given standards and then it sends the calibration factors to the meter being calibrated for storage in memory to thereby calibrate the meter.

Due to the unique features of my aforedescribed meter, only one sampling by the meter is required for the calibration stand to compute the relevant calibration factors and therefore calibration may be carried out in three seconds or less.

By synchronizing the voltage and current source of the calibration stand with the meter sampling, the meter is tied in with a particular phase of the sine wave and one can therefore calibrate the meter very rapidly as then one needs only sample one timed cycle cluster of the voltage and current for calibration and also the samplings of voltage and current need not be made simultaneously as required by other digital meters. It is suspected that other digital meters must sample voltage and current frequently and also simultaneously which requires considerably more time for calibration and more powerful and expensive computer hardware not only for the meter, but also for the calibration stand.

The standardized current supplied by the calibration stand can actually be at low voltage whereas the voltage appearing to the meter under calibration is at the design level for that meter.

Since my digital meter is a microprocessor based instrument and performs Fourier analysis on the incoming wave forms, basing all its computations on the Fourier coefficients, it is only necessary that the magnitudes of the correct Fourier terms be known. It is not necessary that the current or voltage wave forms be good sine waves of precisely known magnitudes and there is no requirement that the current and voltage wave forms be the same. It is important that the digital meter have its own clock.

In my aforedescribed digital meter, the analytic cycle lasts for a number of power line cycle periods, but not necessarily an integral number of half cycles. Resulting analytic cycles are not precise in their power output calculations, but they are reproducable. The precision of the resultant meter is the result of a built in inherent statistical process.

To be sure that a particular analytic cycle will produce a particular result, it is necessary for the meter timing and the timing for the calibration wave forms to be synchronized. The output of one analytic cycle is sufficient to produce a calibration factor for the meter and will suffice for all cycles.

BRIEF DESCRIPTION OF THE DRAWING

Other objects and advantages appear in the following description and claims.

The accompanying drawing shows, for the purpose of exemplification, without limiting the invention or the claims thereto, certain practical embodiments illustrating the principals of this invention, wherein the figure is a schematic block diagram illustrating one embodiment of the teachings of the method and apparatus of the present invention.

DESCRIPTION OF THE PREFERRED EMBODIMENT

Referring to the drawing, the digital electric energy consumption meter of the type described in my aforementioned patent specifications is generally and schematically indicated at 10. The calibration stand of the present invention for calibrating the meter 10 is generally indicated at 11.

The digital meter 10 is calibrated electronically by calibration stand 11.

The meter 10 incorporates a computer 12 which includes a microprocessor, appropriate memory, a clock for timing and initiation of sampling of voltage and current, and a calibration sychronizing signal output for generating a calibration start output signal when sampling is initiated, and also an input for entering calibration factors into memory. This latter mentioned input is indicated at 13.

As described in more detail in my aforedescribed patent specifications, this meter uses a sampling technique and Fourier analysis to determine the energy being delivered. The samples are taken in timed clusters, the timing originating at an electric clock residing in the meter. At the start of a cluster the clock, via the meter and lead 14, sends a start signal to the calibration stand 11.

The calibration stand 11 includes separate current and voltage generator circuit 15 and 16 which upon sensing a synchronization calibration start signal from lead 14 generates respectively standardized current and voltage signals which are sent via leads 20 and 21 to meter 10 for sampling.

The computer 12 in meter 10 then samples the voltage and current in timed cycle clusters and computes the energy or power consumed and then via lead 22 sends either computed uncalibrated power or computed algorithmic or Fourier component magnitudes to the computer 23 of calibration stand 11 for computation and generation of calibration factors. Calibration stand 11 through computer 23 thereby calibrates the required factors to calibrate meter 10 and sends these calibration factors back to the meter 10 via lead or conductor 24 to calibration input 13 of computer 12 and the calibrations are stored in memory in computer 12 thereby calibrating the meter 10.

Both conductors 20 and 21 would be three or four conductor cables depending on whether the meter was for three wire single phase power or four wire three phase power. Only two wires would be used in each of 20 and 21 for two wire single phase power.

It is important to note that the meter timing and the timing for the calibration wave forms are synchronized. This permits the output of one analytic cycle to be sufficient in order to produce a calibration factor for the meter and this will suffice for all cycles.

While the standardized current generator and standardized voltage generator 15 and 16 respectively of calibration stand 11 are shown to be separate circuits, they may in fact be one circuit and generate one appropriate sine or other appropriate wave for sampling by meter 10. However, by providing separate circuits very little power is actually required for the operation of the calibration stand and for the calibration operation as the current may be of low voltage magnitude. In this form, one possible wave shape for the current and voltage wave forms is that they be approximate square waves with a period equal to that of the power line (1/60 second, for example).

If the calibration is correct for one harmonic, it will be correct for the fundamental as well. Since it may be easier to generate currents in particular that are of higher frequency because lower currents are required, for example, it may be desirable to use 180 Hz current at 1/3 the magnitude instead of 60 Hz current.

There is no requirement that the current and voltage wave forms be the same.

Since reproduction precision is needed cycle by cycle in this process, the wave forms could be done digitally rather, for example, than by using multivibrator type analog circuits. The relevant harmonics of both wave forms will be known and the expected output for the fundamental and the harmonics can be checked.

The sources of current and voltage 15 and 16 of calibration stand 11 must and are linked to the meter for synchronizing purposes through the sychronization calibration start signal as indicated on lead 14. This pulse is used to start a sequence of voltage and current pulses from generators 15 and 16 for calibration.

For calibration purposes it is not necessary for any power output to be determined. It is sufficient for the various coefficients for each of the algorithmic or Fourier Series to be calibrated. As a result, it is not necessary for voltage and current to have the same frequency. In this case the calibration stand 11 would not insure the overall meter operation, but it would insure correct output if the meter functions properly otherwise.

To determine calibration factors, one for each current and voltage pickup, the ratio of the preset power reading expected to that observed is noted or computed by computer 23. Accordingly, an output reading for the fundamental and/or one or more harmonics must be readable electronically from the meter, and to higher precision than the normal output.

The calibration factors, determined for each current or current derivative (and voltage) pickup independently, are finally sent by the calibration stand computer 23 to the meter 10 through connection 24 so that they are entered into an EPROM memory or the like in the meter computer 12.

In ordinary single phase three wire or three phase four wire meters, where each current or current derivative pickup is linked with a specific voltage, only one calibration value per current/voltage pair is required. In three wire three phase systems, each voltage pickup is associated with two current or current derivative pickups, so separate calibrations are needed for each voltage and current pickup.

The factors computed by the calibration stand may be injected into the meter through only one port 13. The meter, through multiplexing means, enters the factors into the proper memory bank of computer 12.

I claim:

1. A method for calibrating a digital electric energy consumption meter, wherein said meter includes means for performing voltage and current sampling in timed cycle clusters and for further performing algorithmic analysis on the sampling to determine the electrical energy being sampled through the use of a computer which includes a microprocessor, memory, and a clock for timing and initiation of sampling, said method comprising the steps of: generating and sending a synchronizing start signal from said meter to a calibration stand at a time said meter initiates sampling, receiving the start signal at the calibration stand and thereupon sending standardized current and voltage from said stand to said meter, calculating with said meter and sending back to the calibration stand either computed uncalibrated power or computed algorithmic component magnitudes, and computing in the stand the relevant calibration factors for the meter being calibrated by analyzing the computed power or magnitudes, sending the calibration factors from the stand to said meter being calibrated, and storing said factors in memory in said meter to thereby calibrate said meter.

2. The method of claim 1 wherein the standardized current and voltage have different frequencies.

3. The method of claim 1 wherein the standardized current and voltage are generated by separate circuits.

4. The method of claim 1 wherein only one sampling by said meter is performed for computing the relevant calibration factors by the calibration stand.

5. The method of claim 1 wherein the algorithmic analysis performed is low order Fourier Series analysis.

6. A calibration stand for calibrating a digital electric energy consumption meter wherein said meter includes, means for performing voltage and current sampling in timed cycle clusters and for further performing algorithmic analysis on the samplings to determine the electrical energy being delivered through the use of a computer which includes a microprocessor, memory, and a clock for timing and initiation of sampling, calibration synchronizing signal output means for generating a calibration start output signal when sampling initiates, and input means for receiving and entering calibration factors into memory; a calibration stand connected to said meter for receiving the start output signal and comprising current and voltage generation means for generating standardized current and voltage signals for sampling by said meter when said calibration stand receives the calibration start output signal; said meter connected to said calibration stand to receive said standardized current and voltage signals for said analysis; and computer means in said stand and connected to said meter for receiving either computed uncalibrated power or computed algorithmic component magnitudes from the meter as a result of said analysis, for evaluating the same by computing relevant calibration factors for said meter being calibrated, for sending the calibration factors to the calibration input of said meter being calibrated, and for storing the factors in memory in said meter to thereby calibrate said meter.

7. The calibration stand of claim 6 wherein the algorithmic analysis performed is low order Fourier Series analysis.

8. The calibration stand of claim 6 wherein the standardized current and voltage have different frequencies.

9. The calibration stand of claim 6 wherein the standardized current and voltage are generated by separate circuits.

10. The calibration stand of claim 6 wherein only one sampling by said meter is required for the calibration stand to compute the relevant calibration factors.

11. The calibration stand of claim 6 wherein said meter calibration input is a multiplexing input.

* * * * *